(12) United States Patent
Song et al.

(10) Patent No.: US 9,806,292 B2
(45) Date of Patent: Oct. 31, 2017

(54) OLED PACKAGING METHOD, PACKAGED STRUCTURE AND DISPLAY DEVICE

(71) Applicant: Boe Technology Group Co., Ltd., Beijing (CN)

(72) Inventors: Wenfeng Song, Beijing (CN); Chunjan Wang, Beijing (CN); Donghui Yu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/914,074

(22) PCT Filed: Jul. 20, 2015

(86) PCT No.: PCT/CN2015/084427
§ 371 (c)(1),
(2) Date: Feb. 24, 2016

(87) PCT Pub. No.: WO2016/155153
PCT Pub. Date: Oct. 6, 2016

(65) Prior Publication Data
US 2017/0040571 A1    Feb. 9, 2017

(30) Foreign Application Priority Data
Apr. 3, 2015   (CN) .......................... 2015 1 0156237

(51) Int. Cl.
*H01L 51/52* (2006.01)
*H01L 51/56* (2006.01)
*H01L 27/32* (2006.01)

(52) U.S. Cl.
CPC .......... *H01L 51/5256* (2013.01); *H01L 27/32* (2013.01); *H01L 51/52* (2013.01); *H01L 51/56* (2013.01); *H01L 2251/303* (2013.01)

(58) Field of Classification Search
CPC ........................... H01L 51/5256; H01L 51/56
See application file for complete search history.

(56) References Cited

U.S. PATENT DOCUMENTS 9,660,205 B2 * 5/2017 George .............. H01L 51/0097
2009/0081360 A1 * 3/2009 Fedorovskaya ... C23C 16/45529
427/160

(Continued)

FOREIGN PATENT DOCUMENTS

CN    1273697    11/2000
CN    101553600    10/2009

(Continued)

OTHER PUBLICATIONS

Ott et al. Al3O3 thin film growth on Si(100) using binary reaction sequence chemistry, 1997, Thin Solid Films, pp. 135-144.*
Dillon et al. Surface chemistry of Al2O3 deposition using Al(CH3)3 and H2O in a binary reaction sequence, 1995, Surface Science 322, pp. 230-242.*

(Continued)

*Primary Examiner* — Allan R Wilson
(74) *Attorney, Agent, or Firm* — Calfee, Halter & Griswold LLP

(57) ABSTRACT

An OLED packaging method, a packaged structure, and a display device are disclosed. The packaging method comprises forming at least one group of films on an OLED to be packaged. Each group of films comprises three films, and an intermediate film in each group of films is an intermediate inorganic-organic hybrid layer. The intermediate inorganic-organic hybrid layer is arranged as an intermediate film in each group of films, and connects an upper film and a lower film in each group of films, so that adhesion between the upper film and the lower film in each group of films is effectively improved, and stripping of the upper and lower films is avoided.

9 Claims, 1 Drawing Sheet

(56) References Cited

U.S. PATENT DOCUMENTS

| | | |
|---|---|---|
| 2009/0137043 A1 | 5/2009 | Parsons et al. |
| 2009/0215279 A1* | 8/2009 | Kim .................. H01L 51/448 438/763 |
| 2009/0242229 A1 | 10/2009 | Sakai |
| 2010/0112270 A1* | 5/2010 | Bulliard ................ C09J 7/0221 428/76 |
| 2010/0178481 A1 | 7/2010 | George et al. |
| 2011/0290551 A1 | 12/2011 | Lee |
| 2012/0258294 A1* | 10/2012 | Leyder ................... C03C 17/42 428/212 |
| 2013/0337259 A1 | 12/2013 | Carcia et al. |
| 2014/0087497 A1 | 3/2014 | Mandlik et al. |
| 2014/0225084 A1* | 8/2014 | Oh ..................... H01L 51/5253 257/40 |
| 2015/0348803 A1* | 12/2015 | Moro .................. H01L 51/5237 257/790 |

FOREIGN PATENT DOCUMENTS

| | | |
|---|---|---|
| CN | 101697343 | 4/2010 |
| CN | 103187455 | 7/2013 |
| CN | 203481275 | 3/2014 |
| CN | 104733641 | 6/2015 |
| JP | 2004136466 | 5/2004 |
| JP | 2013022829 | 2/2013 |

OTHER PUBLICATIONS

Office action from Chinese Application No. 201510156237.3 dated Jul. 4, 2016.
International Search Report and Written Opinion from PCT/CN15/84427 dated Jan. 12, 2016.
Office action from Chinese Application No. 20151056237.3 dated Aug. 25, 2016.

* cited by examiner

US 9,806,292 B2

OLED PACKAGING METHOD, PACKAGED STRUCTURE AND DISPLAY DEVICE

RELATED APPLICATIONS

The present application is the U.S. national phase entry of PCT/CN2015/084427, with an international filing date of Jul. 20, 2015, which claims the benefit of Chinese Patent Application No. 201510156237.3, filed on Apr. 3, 2015, the entire disclosures of which are incorporated herein by reference.

FIELD OF THE INVENTION

The present invention relates to a field of OLED packaging, and particularly to an OLED packaging method, a packaged structure, and a display device.

BACKGROUND OF THE INVENTION

OLEDs (organic light-emitting diodes) have become one of the next generation of display devices that are competitive and promising, due to its advantages of all solid state structure, high brightness, full viewing angle, rapid response, and flexible display. It is demonstrated by researches that moisture and oxygen in the air have significant effect on the lifetime of OLED. Therefore, if the OLED is packaged effectively and is isolated from moisture and oxygen in air, the lifetime of OLEDs can be greatly increased, and thus the lifetime of a display device comprising OLEDs can be increased.

In a relevant technique for packaging the OLED, at least one group of films is generally deposited on the OLED to be packaged, and each group of films comprises an organic layer and an inorganic layer.

SUMMARY OF THE INVENTION

The prior art suffers from a number of problems. Due to weak adhesion between an organic layer and an inorganic layer in each group of films, when an OLED is packaged by this kind of packaging approach, the phenomenon of stripping of films tends to appear.

To this end, embodiments of the present invention provide an OLED packaging method, a packaged structure, and a display device, which intends to at least overcome or alleviate one or more problem in the art. For example, according to the present invention, stripping of films among films in the packaged OLED can be avoided.

In particular, the following technical solutions are adopted in embodiments of the present invention.

In a first aspect, an OLED packaging method si provided, comprising:

forming at least one group of films on an OLED to be packaged, wherein each group of films comprises three films, and an intermediate film in each group of films is an intermediate inorganic-organic hybrid layer.

On basis of the first aspect, in a first possible implementation of the first aspect, forming at least one group of films on the OLED to be packaged comprises:

transferring the OLED to be packaged into an ALD (atomic layer deposition) processing chamber; and depositing at least one group of films on the OLED to be packaged by means of ALD technology in the ALD processing chamber.

On basis of the first aspect or a first possible implementation of the first aspect, in a second possible implementation of the first aspect, each group of films comprises a first inorganic layer, and an intermediate inorganic-organic hybrid layer, and a second inorganic layer. The intermediate inorganic-organic hybrid layer is arranged between the first inorganic layer and the second inorganic layer.

On basis of the first aspect or the first possible implementation of the first aspect, in a third possible implementation of the first aspect, each group of films comprises a first inorganic-organic hybrid layer, an intermediate inorganic-organic hybrid layer, and a second inorganic-organic hybrid layer, and the intermediate inorganic-organic hybrid layer is arranged between the first inorganic-organic hybrid layer and the second inorganic-organic hybrid layer.

On basis of the first possible implementation of the first aspect, in a fourth possible implementation of the first aspect, in case each group of films comprises at least one inorganic layer, the packaging method comprises: during depositing each inorganic layer in each group of films, successively introducing an inorganic precursor, an inert gas, an oxidizing agent, and an inert gas into the ALD processing chamber to complete one period of inorganic layer deposition; and repeating the one period of inorganic layer deposition, until the inorganic layer reaches a first predefined thickness.

On basis of the first possible implementation of the first aspect, in a fifth possible implementation of the first aspect, the packaging method comprises: during depositing the intermediate inorganic-organic hybrid layer in each group of films, successively introducing an inorganic precursor, an inert gas, an oxidizing agent, an inert gas, an organic precursor, and an inert gas into the ALD processing chamber to complete one period of intermediate inorganic-organic hybrid layer deposition; and repeating the one period of intermediate inorganic-organic hybrid layer deposition, until the intermediate inorganic-organic hybrid layer reaches a second predefined thickness.

On basis of the first possible implementation of the first aspect, in a sixth possible implementation of the first aspect, in case each group of films comprises a first inorganic-organic hybrid layer, the intermediate inorganic-organic hybrid layer, and a second inorganic-organic hybrid layer, the packaging method comprises: during depositing each inorganic-organic hybrid layer in the first inorganic-organic hybrid layer, the intermediate inorganic-organic hybrid layer and the second inorganic-organic hybrid layer, successively introducing an inorganic precursor, an inert gas, an oxidizing agent, an inert gas, an organic precursor, and an inert gas into the ALD processing chamber to complete one period of inorganic-organic hybrid layer deposition; and repeating the one period of inorganic-organic hybrid layer deposition, until the inorganic-organic hybrid layer reaches a third predefined thickness.

On basis of the sixth possible implementation of the first aspect, in a seventh possible implementation of the first aspect, during depositing the first inorganic-organic hybrid layer or the second inorganic-organic hybrid layer, a dosage of the inorganic precursor is larger than that of the organic precursor;

during depositing the intermediate inorganic-organic hybrid layer, the dosage of the inorganic precursor is smaller than that of the organic precursor;

wherein the dosage is a molar quantity.

On basis of any one of the fourth to seventh possible implementations of the first aspect, in an eighth possible implementation of the first aspect, the inorganic precursor is at least a metallic-element containing gas.

On basis of any one of the fifth to seventh possible implementations of the first aspect, in a ninth possible implementation of the first aspect, the organic precursor is at least one of alcohol, acid, and amine which comprises two or more functional groups.

On basis of any one of the fourth to seventh possible implementations of the first aspect, in a tenth possible implementation of the first aspect, the oxidizing agent is at least one of water and ozone.

In a second aspect, it is provided an OLED packaged structure, the packaged structure is packaged by using the packaging method of any one of the above first aspect to the eighth possible implementation of the first aspect, and the packaged structure comprises at least one group of films;

the at least one group of films encapsulates an OLED to be packaged, wherein each group of films comprises three films, and an intermediate film in each group of films is an intermediate inorganic-organic hybrid layer.

On basis of the second aspect, in a first possible implementation of the second aspect, each group of films comprises a first inorganic layer, an intermediate inorganic-organic hybrid layer, and a second inorganic layer, and the intermediate inorganic-organic hybrid layer is arranged between the first inorganic layer and the second inorganic layer.

On basis of the second aspect, in a second possible implementation of the second aspect, each group of films comprises a first inorganic-organic hybrid layer, an intermediate inorganic-organic hybrid layer, and a second inorganic-organic hybrid layer, and the intermediate inorganic-organic hybrid layer is arranged between the first inorganic-organic hybrid layer and the second inorganic-organic hybrid layer.

On basis of the first possible implementation of the second aspect, in a third possible implementation of the second aspect, an inorganic layer is made from a material of aluminum oxide, titanium oxide or zinc oxide, and the inorganic layer is the first inorganic layer and/or the second inorganic layer.

In a third aspect, it is provided a display device, which comprises the packaged structure of the above second aspect and any one of the possible implementations thereof.

The technical solutions according to embodiments of the present invention provide the following beneficial effects.

The intermediate inorganic-organic hybrid layer is arranged as an intermediate film in each group of films, and connects an upper film and a lower film in each group of films, so that adhesion between the upper film and the lower film in each group of films is effectively improved, and stripping of the upper and lower films is avoided.

BRIEF DESCRIPTION OF THE DRAWINGS

The accompanying drawings for describing embodiments of the present invention will be briefly described hereinafter, for purpose of illustrating technical solutions in these embodiments. Apparently, the drawings described below are merely some embodiments of the present invention. A person of ordinary skill in the art will conceive of other drawings on the basis of these drawings without creative efforts.

DETAILED DESCRIPTION OF THE INVENTION

Figure 1:
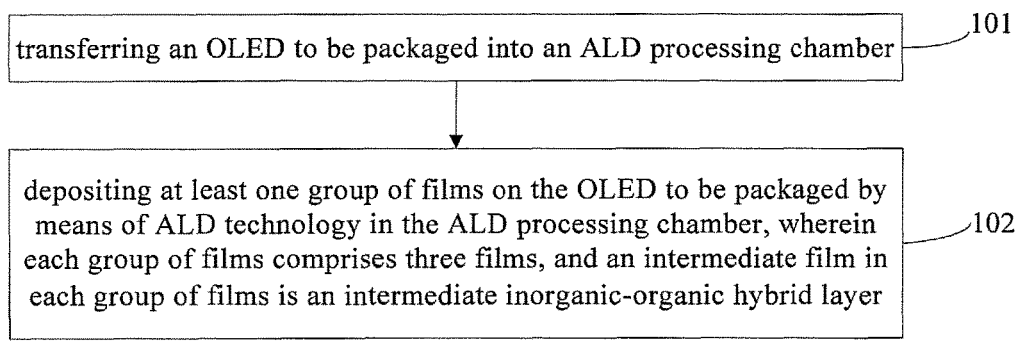
FIG. 1 is a flow chart for an OLED packaging method in an embodiment of the present invention.

In order to make objectives, technical solutions and advantages of the present invention more clear, embodiments of the present invention will be described in details hereinafter in conjunction with the accompanying drawings.

An embodiment of the present invention provides an OLED packaging method, comprising:

forming at least one group of films on an OLED to be packaged, wherein each group of films comprises three films, and an intermediate film in each group of films is an intermediate inorganic-organic hybrid layer.

The step of forming at least one group of films on the OLED to be packaged can be realized by depositing, sputtering, coating, or the like.

According to the packaging method of the present invention, the intermediate inorganic-organic hybrid layer is arranged as an intermediate film in each group of films, and connects an upper film and a lower film in each group of films, so that adhesion between the upper film and the lower film in each group of films is effectively improved, and stripping of the upper and lower films is avoided.

In another embodiment, forming at least one group of films on the OLED to be packaged comprises:

transferring the OLED to be packaged into an ALD processing chamber;

depositing at least one group of films on the OLED to be packaged by means of ALD technology in the ALD processing chamber.

In another embodiment, each group of films comprises a first inorganic layer, an intermediate inorganic-organic hybrid layer, and a second inorganic layer, wherein the intermediate inorganic-organic hybrid layer is arranged between the first inorganic layer and the second inorganic layer.

In another embodiment, each group of films comprises a first inorganic-organic hybrid layer, an intermediate inorganic-organic hybrid layer, and a second inorganic-organic hybrid layer, wherein intermediate inorganic-organic hybrid layer is arranged between the first inorganic-organic hybrid layer and the second inorganic-organic hybrid layer.

In another embodiment, in case each group of films comprises at least one inorganic layer, the packaging method comprises: during depositing each inorganic layer in each group of films, successively introducing an inorganic precursor, an inert gas, an oxidizing agent, and an inert gas into the ALD processing chamber to complete one period of inorganic layer deposition;

repeating the one period of inorganic layer deposition, until the inorganic layer reaches a first predefined thickness.

In another embodiment, the packaging method comprises: during depositing the intermediate inorganic-organic hybrid layer in each group of films, successively introducing an inorganic precursor, an inert gas, an oxidizing agent, an inert gas, an organic precursor, and an inert gas into the ALD processing chamber to complete one period of intermediate inorganic-organic hybrid layer deposition;

repeating the one period of intermediate inorganic-organic hybrid layer deposition, until the intermediate inorganic-organic hybrid layer reaches a second predefined thickness.

In another embodiment, the packaging method comprises: in case each group of films comprises a first inorganic-organic hybrid layer, the intermediate inorganic-organic hybrid layer, and a second inorganic-organic hybrid layer, during depositing each inorganic-organic hybrid layer in the first inorganic-organic hybrid layer, the intermediate inorganic-organic hybrid layer and the second inorganic-organic hybrid layer, successively introducing an inorganic precursor, an inert gas, an oxidizing agent, an inert gas, an organic precursor, and an inert gas into the ALD processing chamber to complete one period of inorganic-organic hybrid layer deposition;

repeating the one period of inorganic-organic hybrid layer deposition, until the inorganic-organic hybrid layer reaches a third predefined thickness.

In another embodiment, during depositing the first inorganic-organic hybrid layer or the second inorganic-organic hybrid layer, a dosage of the inorganic precursor is larger than that of the organic precursor, wherein the dosage is a molar quantity;

during depositing the intermediate inorganic-organic hybrid layer, the dosage of the inorganic precursor is smaller than that of the organic precursor, wherein the dosage is a molar quantity.

In another embodiment, the inorganic precursor is at least a metallic-element containing gas.

In another embodiment, the organic precursor is at least one of alcohol, acid, and amine which comprises two or more functional groups.

In another embodiment, the oxidizing agent is at least one of water and ozone.

All of the above possible technical solutions can be combined in any manner to develop possible embodiments of the present invention, which are not described herein for simplicity.

On basis of the above embodiments, an embodiment of the present invention provides an OLED packaging method, as shown in FIG. 1 which illustrates a flow chart for an OLED packaging method. The present embodiment is described by taking depositing at least one group of films on an OLED to be packaged as an example. As shown in FIG. 1, the OLED packaging method comprises the following steps.

At step 101, the OLED to be packaged is transferred into an ALD processing chamber.

The OLED to be packaged is an OLED backplate which has been subject to evaporation. By transferring the OLED to be packaged into the ALD processing chamber, the OLED can be packaged in the ALD processing chamber by means of ALD technology.

At step 102, at least one group of films is deposited on the OLED to be packaged in the ALD processing chamber by means of ALD technology. Each group of films comprises three films, and an intermediate film in each group of films is an intermediate inorganic-organic hybrid layer.

At least one group of films can be deposited on the OLED to be packaged in the ALD processing chamber in various manners which depend on the composition of each group of films. Therefore, these manners in which at least one group of films is deposited will be described hereinafter with reference to the composition of each group of films.

The present invention is not limited in term of the composition of each group of films. In implementations, each group of films comprises, but not limited to a first composition and a second composition as follow.

In the first composition of the present invention, each group of films comprises a first inorganic layer, an intermediate inorganic-organic hybrid layer, and a second inorganic layer, wherein the intermediate inorganic-organic hybrid layer is arranged between the first inorganic layer and the second inorganic layer.

In case of this composition, depositing each group of films can be realized by the following step 1.1-step 1.3.

At step 1.1, a first inorganic layer is deposited on the OLED to be packaged in the ALD processing chamber by means of ALD technology.

Depositing the first inorganic layer in the ALD processing chamber by means of ALD technology, comprises, but not limited to, the following step A and step B.

At step A, an inorganic precursor, an inert gas, an oxidizing agent, and an inert gas are successively introduced into the ALD processing chamber to complete one period of inorganic layer deposition.

A material of the inorganic precursor can be metal organic sources or halides which are applicable to ALD, such as trimethylaluminum (TMA), titanium tetrachloride ($TiCl_4$), diethylzinc (DEZ). The inert gas can be high purity nitrogen ($N_2$), helium (He), or the like. The oxidizing agent can be $H_2O$, ozone ($O_3$), or the like. In particular, $O_2$ resulting from decomposition of $H_2O$ can act as the oxidizing agent. By means of the inert gas, the inorganic precursor which has not reacted in the ALD processing chamber can be expelled from the ALD processing chamber. By means of the oxidizing agent, the inorganic precursor can be oxidized into a material required for the inorganic layer. The material required for the inorganic layer comprises, but not limited to, aluminum oxide (AlO), titanium oxide ($TiO_x$), zinc oxide (ZnO), or the like. For example, in case the first inorganic layer is aluminum oxide, aluminum oxide can be obtained by oxidizing the inorganic precursor by means of the oxidizing agent.

The inorganic precursor which is introduced into the ALD processing chamber once is at least a metallic-element containing gas. For example, inorganic precursor which is introduced into the ALD processing chamber once can be only titanium tetrachloride, but can also a mixture of be trimethylaluminum and titanium tetrachloride. In case the inorganic precursor which is introduced into the ALD processing chamber once is at least two kinds of metallic-element containing gases, a binary or multi-component compound inorganic layer can be obtained, so that the inorganic layer has properties of multiple metals. By adjusting introducing amounts for various metallic-element containing gases, optimal packaging performance can be obtained.

Furthermore, the present invention is not limited in term of the introducing amounts and durations for the inorganic precursor, the inert gas, and the oxidizing agent, which can be determined as needed.

By means of step A, an inorganic layer can be deposited on the OLED to be packaged. However, sine the first inorganic layer generally has a specific thickness, it is required to further perform the following step B.

At step B, the one period of inorganic layer deposition is repeated until the first inorganic layer reaches a first predefined thickness.

The first predefined thickness indicates a thickness of the first inorganic layer. The present invention is not limited in term of the value of the first predefined thickness. Furthermore, the times for repeating can be determined on basis of the thickness of the first inorganic layer and the thickness of the inorganic layer which is deposited in each period of inorganic layer deposition.

At step 1.2, an intermediate inorganic-organic hybrid layer is deposited on the first inorganic layer in the ALD processing chamber by means of ALD technology.

In particular, depositing the intermediate inorganic-organic hybrid layer on the first inorganic layer in the ALD processing chamber by means of ALD technology can be realized by the following step A and step B.

At step A, an inorganic precursor, an inert gas, an oxidizing agent, an inert gas, an organic precursor, and an inert gas are introduced successively into the ALD processing chamber to complete one period of intermediate inorganic-organic hybrid layer deposition.

Reference can be made to the above step 1.1 for potential materials of the inorganic precursor, the inert gas, and the oxidizing agent, which are not repeated here for simplicity. A material for the organic precursor can be alcohol, acid, and amine which comprises two or more functional groups, such as glycol ($HOCH_2CH_2OH$), fumaric acid ($HOOCCH=CHCOOH$), trimesic acid (1,3,5-BTC), ethylenediamine ($H_2NCH_2CH_2NH_2$), or the like.

Furthermore, the present invention is not limited in term of the introducing amounts and durations for the inorganic precursor, the inert gas, the oxidizing agent, and the organic precursor. In implementations, the introducing timings and amounts for the inorganic precursor and organic precursor can be determined as needed, thus obtaining the intermediate inorganic-organic hybrid layer with different thicknesses and components.

By means of step A, an intermediate inorganic-organic hybrid layer can be deposited on the OLED to be packaged. However, since the intermediate inorganic-organic hybrid layer generally has a specific thickness, it is required to further perform the following step B.

At step B, the one period of intermediate inorganic-organic hybrid layer deposition is repeated until the intermediate inorganic-organic hybrid layer reaches a second predefined thickness.

The present invention is not limited in term of the value of the second predefined thickness, which can be determined as needed during packaging. Furthermore, the times for repeating can be determined on basis of the second predefined thickness and the thickness of the intermediate inorganic-organic hybrid layer which is deposited in each period of intermediate inorganic-organic hybrid layer deposition.

At step 1.3, a second inorganic layer is deposited on the intermediate inorganic-organic hybrid layer in the ALD processing chamber by means of ALD technology.

Reference can be made to the above step 1.1 for the principle of this step, which is not repeated here for simplicity.

It is noted that the second inorganic layer can have a same thickness as the first inorganic layer, or a different thickness, and the present invention is not limited in term of the relationship between the thickness of the first and second inorganic layer.

Since each group of films comprises two inorganic layers, it is possible to avoid a problem in which the effect for blocking moisture and oxygen is poor in case the outermost packaging film of the OLED to be packaged is an organic layer. Therefore, it is possible to isolate the OLED to be packaged from the moisture and oxygen in air, so as to increase the lifetime.

In the second composition of the present invention, each group of films comprises a first inorganic-organic hybrid layer, an intermediate inorganic-organic hybrid layer, and a second inorganic-organic hybrid layer, wherein intermediate inorganic-organic hybrid layer is arranged between the first inorganic-organic hybrid layer and the second inorganic-organic hybrid layer.

In case of this composition, depositing each group of films can be realized by the following step 2.1 to step 2.3.

Step 2.1, a first inorganic-organic hybrid layer is deposited on the OLED to be packaged in the ALD processing chamber by means of ALD technology.

Depositing the first inorganic-organic hybrid layer in the ALD processing chamber by means of ALD technology can be realized by the following step C and step D.

At step C, an inorganic precursor, an inert gas, an oxidizing agent, an inert gas, an organic precursor, and an inert gas are successively introduced into the ALD processing chamber to complete one period of inorganic-organic hybrid layer deposition.

The principle for step C is the same as that of the above step A in step 1.2 for depositing the intermediate inorganic-organic hybrid layer, and reference can be made to the above step A for this principle, which is not repeated here for simplicity.

At step d, the one period of inorganic-organic hybrid layer deposit is repeated until the first inorganic-organic hybrid layer reaches a third predefined thickness.

In this step, the third predefined thickness indicates a thickness of the first inorganic-organic hybrid layer, and the present invention is not limited to the value of third predefined thickness. Furthermore, the times for repeating can be determined on basis of the thickness of the first inorganic-organic hybrid layer and thickness of the inorganic-organic hybrid layer which is deposited in each period of inorganic-organic hybrid layer deposition.

At step 2.2, an intermediate inorganic-organic hybrid layer is deposited on the first inorganic-organic hybrid layer in the ALD processing chamber by means of ALD technology.

The principle for this step is the same as the step 1.2 for the above first composition, as well as the above step 2.1, and reference can be made to the above step 1.2 and step 2.1 for this principle, which is not repeated here for simplicity.

At step 2.3, a second inorganic-organic hybrid layer is deposited on the intermediate inorganic-organic hybrid layer in the ALD processing chamber by means of ALD technology.

The principle for this step is the same as the above step 2.1, and reference can be made to the above step 2.1 for this principle, which is not repeated here for simplicity.

It is noted that the first inorganic-organic hybrid layer, the intermediate inorganic-organic hybrid layer, and the second inorganic-organic hybrid layer can have a same thickness, or different thicknesses. The present invention is not limited in this aspect.

For example, the first inorganic-organic hybrid layer, the intermediate inorganic-organic hybrid layer, or the second inorganic-organic hybrid layer can present different properties. During depositing the first inorganic-organic hybrid layer or the second inorganic-organic hybrid layer, the dosage for the inorganic precursor can be larger than that of the organic precursor, so that the first inorganic-organic hybrid layer or the second inorganic-organic hybrid layer has a tendency to present an inorganic property. During depositing the intermediate inorganic-organic hybrid layer, the dosage of the inorganic precursor can be smaller than that of the organic precursor, so that the intermediate inorganic-organic hybrid layer has a tendency to present an organic property. The dosage can be characterized by a molar quantity. Namely, during depositing the first inorganic-organic hybrid layer or the second inorganic-organic hybrid layer, the molar quantity for the inorganic precursor can be larger than that of the organic precursor. During depositing the intermediate inorganic-organic hybrid layer, the molar quantity for the inorganic precursor can be smaller than that of the organic precursor.

By controlling the dosage in this manner, the first inorganic-organic hybrid layer and the second inorganic-organic hybrid layer have a tendency to present an inorganic property, and the intermediate inorganic-organic hybrid layer has a tendency to present an organic property. In this way, it is possible to avoid a problem in which the effect for blocking moisture and oxygen is poor in case an outer film in packaging films for the OLED to be packaged has a tendency to present an organic property. Furthermore, by making the intermediate inorganic-organic hybrid layer to have a tendency to present an organic property, it is ensured that particles can be well covered by the films.

Furthermore, on basis of the above first composition, during transition from depositing the first inorganic layer to depositing the intermediate inorganic-organic hybrid layer, to ensure cleanness of the deposited films, it is required to clean the packaged films. Namely, cleaning steps are required during depositing films of different properties. However, in the second composition, each film in each group of films is an inorganic-organic hybrid layer. Therefore, the cleaning steps can be reduced, thus simplifying the packaging process.

According to the packaging method of the present invention, the intermediate inorganic-organic hybrid layer is arranged as an intermediate film in each group of films, and connects an upper film and a lower film in each group of films, so that adhesion between the upper film and the lower film in each group of films is effectively improved, and stripping of the upper and lower films is avoided. Furthermore, the films formed by means of ALD technology are denser and have better moisture and oxygen blocking property, so that the lifetime of OLED can be increased. Besides, these films have thicknesses smaller than those of films formed by PECVD (plasma enhanced chemical vapor deposition). In case the packaging process is completed only in the ALD processing chamber, as compared with the case the packaging process is completed in processing chambers, the particles during transferring the OLED to be packaged among processing chambers can be reduced.

Furthermore, in the second composition of the present invention, each film in each group of films is an inorganic-organic hybrid layer, and the first inorganic-organic hybrid layer surrounds the OLED to be packaged. The first inorganic-organic hybrid layer can effectively improve adhesion between the OLED to be packaged and the packaging films, avoid the packaging films from stripping from the OLED, and thus can effectively package the OLED and increase its lifetime.

An embodiment of the present invention provides an OLED packaged structure, which can be packaged by the packaging method in the above embodiments. The packaged structure comprises at least one group of films. At least one group of films encapsulates the OLED to be packaged. Each group of films comprises three films, and an intermediate film in each group of films is an intermediate inorganic-organic hybrid layer. The device to be packaged is an OLED backplate which has been subject to evaporation. The present invention is not limited in term of the manner for fabricating the OLED backplate and the structure of the OLED backplate.

According to the packaged structure of the present invention, the intermediate inorganic-organic hybrid layer is arranged as an intermediate film in each group of films, and connects an upper film and a lower film in each group of films, so that adhesion between the upper film and the lower film in each group of films is effectively improved, and stripping of the upper and lower films is avoided.

In particular, on basis of the composition of each group of films, the packaged structure can have different structures, which will be described hereinafter with reference to FIG. 2 and FIG. 3.

Figure 2:
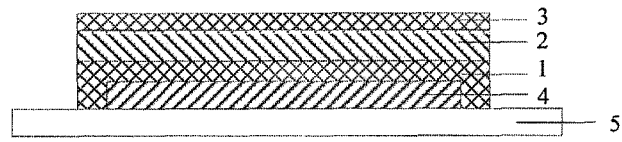
FIG. 2 is a schematic view for an OLED packaged structure in another embodiment of the present invention.

FIG. 2 shows a structural schematic view of a packaged structure. In this kind of packaged structure, each group of films comprises a first inorganic layer, an intermediate inorganic-organic hybrid layer, and a second inorganic layer. The intermediate inorganic-organic hybrid layer is arranged between the first inorganic layer and the second inorganic layer.

In FIG. 2, "1" indicates the first inorganic layer, "2" indicates the intermediate inorganic-organic hybrid layer, "3" indicates the second inorganic layer, "4" indicates the OLED to be packaged, and "5" indicates the OLED backplate. As shown in FIG. 2, the first inorganic layer 1 surrounds the OLED to be packaged 4, and is deposited close to the OLED to be packaged 4. The intermediate inorganic-organic hybrid layer 2 is deposited on the first inorganic layer 1, and the second inorganic layer 3 is deposited on the intermediate inorganic-organic hybrid layer 2.

Figure 3:
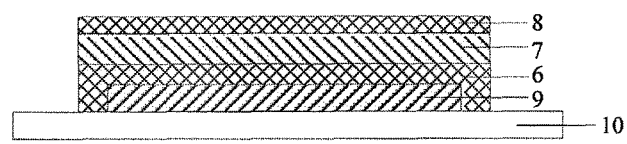
FIG. 3 is a schematic view for an OLED packaged structure in another embodiment of the present invention.

FIG. 3 shows a structural schematic view of another packaged structure. In this kind of packaged structure, each group of films comprises a first inorganic-organic hybrid layer, an intermediate inorganic-organic hybrid layer, and a second inorganic-organic hybrid layer. The intermediate inorganic-organic hybrid layer is arranged between the first inorganic-organic hybrid layer and the second inorganic-organic hybrid layer.

In FIG. 3, "6" indicates the first inorganic-organic hybrid layer, "7" indicates the intermediate inorganic-organic hybrid layer, "8" indicates the second inorganic-organic hybrid layer, "9" indicates the OLED to be packaged, and "10" indicates the OLED backplate. As shown in FIG. 3, the first inorganic-organic hybrid layer 6 surrounds the OLED to be packaged 9, and is deposited close to the OLED to be packaged 9, the intermediate inorganic-organic hybrid layer 7 is deposited on the first inorganic-organic hybrid layer 6, and the second inorganic-organic hybrid layer 8 is deposited on the intermediate inorganic-organic hybrid layer 7.

In the respective packaged structure shown in FIG. 2 and FIG. 3, the first inorganic layer and/or the second inorganic layer can have a material of metal oxide, which comprises, but not limited to, aluminum oxide, titanium oxide, and zinc oxide.

It is noted that, the method for forming each film in the packaged structure as well as the relevant materials have been described in embodiments for the OLED packaging method, which are not repeated in the embodiment.

All of the above possible technical solutions can be combined in any manner to develop possible embodiments of the present invention, which are not described herein for simplicity.

An embodiment of the present invention provides a display device, comprising the packaged structure in any one of the above embodiment. The display device can be any product or component with a display function, such as mobile phone, tablet computer, TV, monitor, notebook computer, desktop computer, digital photo frame, and navigator.

It is understood by the person of ordinary skill in the art that all or some steps in the above embodiments can not only be fulfilled by a hardware, but also by a program which instructs a relevant hardware, and the program can be stored in a computer readable storage medium, which can be a read-only memory, a disk, an optical disc, or the like.

Although the present invention has been described above with reference to preferred embodiments, it should be understood that the limitations of the described embodiments are merely for illustrative purpose and by no means limiting. Instead, the scope of the invention is defined by the appended claims rather than by the description, and all variations that fall within the range of the claims are intended to be embraced therein.

The invention claimed is:

1. An OLED packaging method comprising:
    forming at least one group of films on an OLED to be packaged, wherein each group of films comprises three films, and an intermediate film in each group of films is an intermediate inorganic-organic hybrid layer,
    wherein forming at least one group of films on the OLED to be packaged comprises:
    transferring the OLED to be packaged into an ALD processing chamber; and
    depositing at least one group of films on the OLED to be packaged by means of ALD technology in the ALD processing chamber,
    wherein during depositing the intermediate inorganic-organic hybrid layer in each group of films, successively introducing an inorganic precursor, an inert gas, an oxidizing agent, an inert gas, an organic precursor, and an inert gas into the ALD processing chamber to complete one period of intermediate inorganic-organic hybrid layer deposition; and
    repeating the one period of intermediate inorganic-organic hybrid layer deposition, until the intermediate inorganic-organic hybrid layer reaches a second predefined thickness.

2. The method of claim 1, wherein each group of films comprises a first inorganic layer, an intermediate inorganic-organic hybrid layer, and a second inorganic layer, wherein the intermediate inorganic-organic hybrid layer is arranged between the first inorganic layer and the second inorganic layer.

3. The method of claim 1, wherein each group of films comprises a first inorganic-organic hybrid layer, an intermediate inorganic-organic hybrid layer, and a second inorganic-organic hybrid layer, wherein the intermediate inorganic-organic hybrid layer is arranged between the first inorganic-organic hybrid layer and the second inorganic-organic hybrid layer.

4. The method of claim 1, wherein
    in case each group of films comprises at least one inorganic layer, during depositing each inorganic layer in each group of films, successively introducing an inorganic precursor, an inert gas, an oxidizing agent, and an inert gas into the ALD processing chamber to complete one period of inorganic layer deposition; and
    repeating the one period of inorganic layer deposition, until the inorganic layer reaches a first predefined thickness.

5. The method of claim 1, wherein
    in case each group of films comprises a first inorganic-organic hybrid layer, the intermediate inorganic-organic hybrid layer, and a second inorganic-organic hybrid layer, during depositing each inorganic-organic hybrid layer in the first inorganic-organic hybrid layer, the intermediate inorganic-organic hybrid layer and the second inorganic-organic hybrid layer, successively introducing an inorganic precursor, an inert gas, an oxidizing agent, an inert gas, an organic precursor, and an inert gas into the ALD processing chamber to complete one period of inorganic-organic hybrid layer deposition; and
    repeating the one period of inorganic-organic hybrid layer deposition, until the inorganic-organic hybrid layer reaches a third predefined thickness.

6. The method of claim 5, wherein
    during depositing the first inorganic-organic hybrid layer or the second inorganic-organic hybrid layer, a dosage of the inorganic precursor is larger than that of the organic precursor; and
    during depositing the intermediate inorganic-organic hybrid layer, the dosage of the inorganic precursor is smaller than that of the organic precursor;
    wherein the dosage is a molar quantity.

7. The method of claim 4, wherein
    the inorganic precursor is at least a metallic-element containing gas.

8. The method of claim 1, wherein the organic precursor is at least one of alcohol, acid, and amine which comprises two or more functional groups.

9. The method of claim 4, wherein the oxidizing agent is at least one of water and ozone.

* * * * *